May 18, 1965 C. R. LITTLEPAGE, JR., ETAL 3,184,658

SEMICONDUCTOR DEVICE AND HEADER COMBINATION

Filed May 22, 1962 3 Sheets-Sheet 1

Clarence R. Littlepage, Jr.
Joseph V. Semon
INVENTORS

BY John G. Graham
ATTORNEY

Clarence R. Littlepage, Jr.
Joseph V. Semon
INVENTORS
BY John G. Graham
ATTORNEY Clarence R. Littlepage, Jr
Joseph V. Semon
INVENTORS
BY John D. Graham
ATTORNEY United States Patent Office
3,184,658
Patented May 18, 1965

3,184,658

SEMICONDUCTOR DEVICE AND HEADER COMBINATION

Clarence R. Littlepage, Jr., and Joseph V. Semon, Richardson, Tex., assignors to Texas Instruments Incorporated, Dallas, Tex., a corporation of Delaware Filed May 22, 1962, Ser. No. 196,793
7 Claims. (Cl. 317—234)

The present invention relates generally to a header for mounting a semiconductor device, and more particularly to a header having a stabilized electrically isolated, conductive surface for mounting a semiconductor device.

Transistors and other semiconductor devices are commonly mounted on a header and are hermetically sealed within a can to provide a mounting surface and a means for encapsulating the device within a favorable atmosphere. This invention relates to such a semiconductor device enclosure and is specifically concerned with a transistor mounted in electrical contact with one of the leads of the header, but electrically isolated from the metallic header case, commonly referred to as an isolated lead device.

Because semiconductor devices are often subjected to high accelerations and extreme vibrations during use, there is often a high failure rate because of breakage of the electrical connections to the active regions of the device. The breakage is usually attributed to a relative motion between the semiconductor device and the leads passing through the header to which the electrical connections to the semiconductor device are made. This invention eliminates this relative motion, and thus the failure rate due to breakage of the electrical connections is virtually eliminated.

It is therefore an object of this invention to provide a semiconductor device header having a stabilized electrically isolated, conducting surface for mounting of a semiconductor device.

Another object of the invention is to provide a semiconductor device header having a plurality of electrical leads and a stabilized conducting surface the mounting thereon of a semiconductor device electrically connected to one of the leads but electrically isolated from the header case.

A further object of the invention is to provide a semiconductor device header having a plurality of electrically isolated leads and a stabilized mounting surface for a semiconductor device that is electrically isolated from the header case and has a fixed position relative to the leads.

A feature of preferred embodiments of the invention that provides stability of the mounting surface is the fact that the surface is partially embedded in and sealed to a preformed glass foundation.

Other objects, features and advantages of the invention will become apparent from the following detailed description when taken in connection with the appended claims and the attached drawing wherein like reference numerals refer to like parts throughout the several figures, and in which:

The preferred embodiments of the invention can be briefly described with reference to a transistor header of conventional design. One such conventional header comprises an annular metallic shell or case that encases and is hermetically sealed with a preformed glass foundation. A plurality of leads are sealed through the glass and project beyond both surfaces thereof. Moreover, these leads are electrically isolated from each other and the metallic case. According to the preferred embodiments of the invention a conductive semiconductor device mounting member having a flat surface on which the semiconductor device can be mounted is partially embedded in and sealed with the glass so that the flat surface is exposed at the upper surface of the glass. The member is electrically connected to one of the leads and, in one embodiment, forms a portion of a lead that has been preformed before being sealed in the glass. In another embodiment the conductive member is welded at one end to one of the leads before being sealed in the glass. Both of the embodiments have their respective advantages, but in either case, the semiconductor device is mounted on a stabilized flat surface that prevents failure of the device that normally results from severe vibrations and shock.

The invention, in broader terms, contemplates the provision of a conductive semiconductor device mounting member adjacent a surface of the afore-mentioned insulating or glass foundation that is stabilized, namely fixed in relation to the surface and thus is not necessarily embedded in the foundation. In such a case the member can be sealed or tightly secured to the surface of the insulating foundation by any suitable means.

Figures 1, 2:
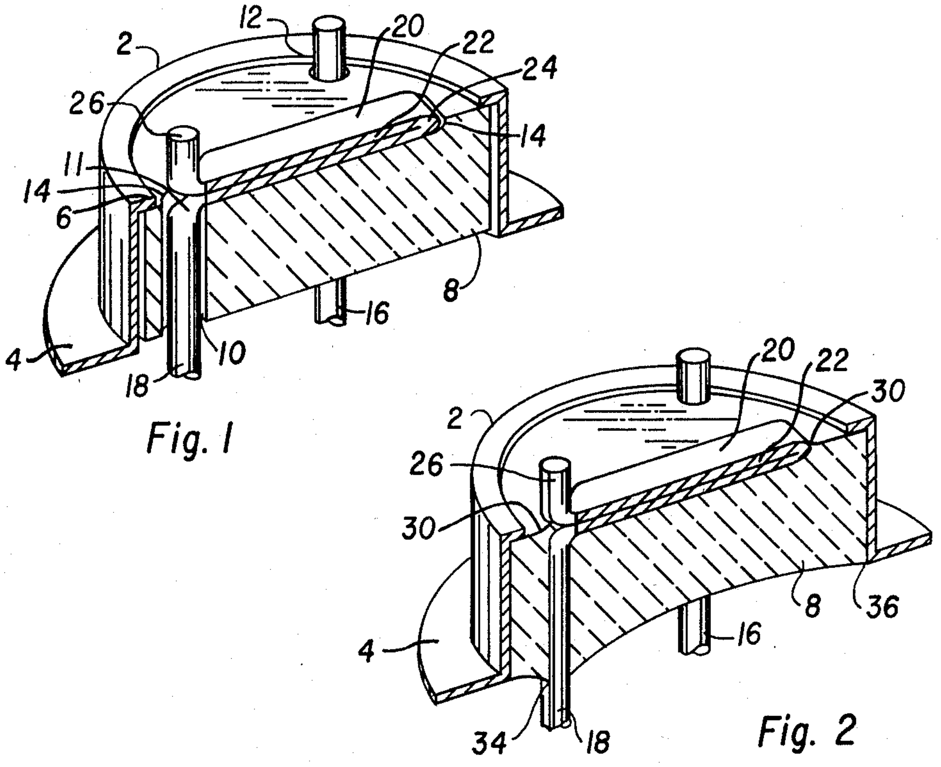
FIG. 1 is a view in section across a semiconductor device header of one embodiment of the invention at an initial stage of fabrication.
FIG. 2 is the header of FIG. 1 at a subsequent stage of fabrication.

Referring now to FIG. 1 there is shown one embodiment of the invention, which is a sectional view taken across a metallic transistor header 2, encasing a glass preform 8 with a pair of leads 16 and 18 passing through the preform. The header has a flange 4 at the bottom and an inwardly extending lip 6 at the top. The glass preform, being provided with holes 10 and 12 of predetermined location, is fitted within the header in abutting relation with the lower surface of the lip 6. A straight metallic lead 16 is inserted through the hole 12 as shown, and a preshaped metallic lead 18 is inserted through the hole 10. The lead 18 is preshaped by bending a straight length of wire at right angles (designated at 11), bending it back on itself at 24 and again bending it at right angles to provide a short portion 26 aligned with that portion 18 passing through the preform. The wire is then flattened by any suitable means at the portion designated at 22 to provide a flat surface 20. To properly orient the flattened portion of the wire in the preform, a suitable recess 14 may be provided in the surface of the preform, as shown, to facilitate handling, although it should be understood that the recess is not critical and may be dispensed with, as described hereinafter.

The unit, after being assembled as described, is conveyed through a furnace to hermetically seal the glass preform to the metallic surfaces with which it is in contact. Particular combinations of metals and glass are especially suitable for this purpose because of their similar coefficients of thermal expansion. A preferred example of such a combination, well known to those in the transistor art, is Kovar, a trade name for a nickel-iron-cobalt alloy, and a borosilicate glass comprised of about 65% silicon dioxide, 3.5% aluminum trioxide, 3.7% potassium oxide, 4.5% sodium oxide, 21.8% boron trioxide and minor percentages of various impurities, and commonly known as Corning Glass 7052. However, any suitable metals or alloys and any suitable insulating material may be used for this purpose. In the preferred example above, the surfaces of the Kovar are oxidized to increase the wetting ability of the glass thereto, and the unit is loaded in a graphite boat (not shown) and conveyed through a furnace, the typical temperatures, times, etc., being well known to those in this art so as to obviate the necessity of a detailed description.

As the unit is passed through the furnace, the glass preform becomes plastic, and there is a tendency of the flattened portion 22 of the lead to float about on the surface of the glass. Since it is desirable that the flattened portion of the lead be maintained in its proper position position and be partially embedded in the surfaces of the glass after the glass has hardened, some means must be provided to ensure that the lead 18 is held rigidly in place during the heating operation. This is accomplished by providing recesses in the graphite boat for receiving those portions of the leads that protrude above the upper surface of the glass preform, such as portion 26 of lead 18.

Referring now to FIG. 2 there is shown a sectional view of the header of FIG. 1 after the preform has been hermetically joined to all of the metallic surfaces which it contacts. The flattened portion 22 of the lead 18 is partially embedded in glass, and a slight meniscus 30 is formed at the extremities of this portion of the lead. Likewise, a slight downward meniscus 34 is formed about the lower portions of the leads. The entire unit is now etched to remove the oxide from the surface of the Kovar and is gold-plated to impart good conducting and chemically inert characteristics to the metallic members.

Figure 3:
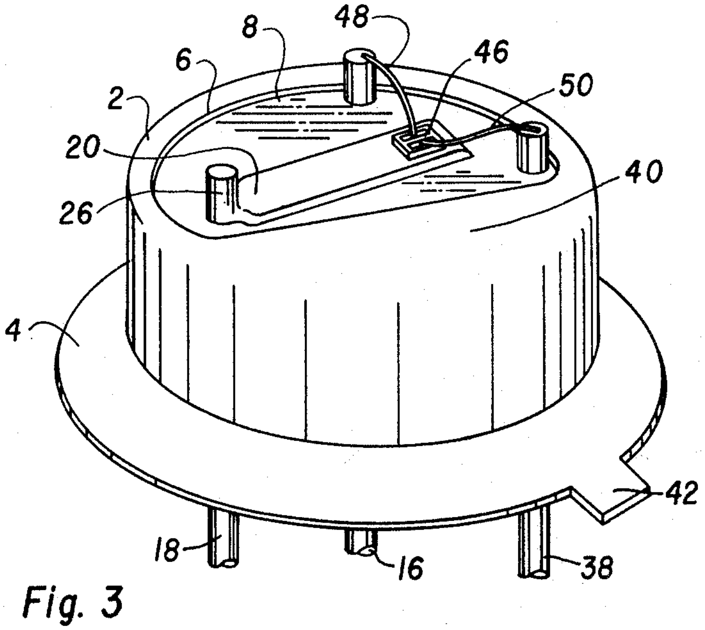
FIG. 3 is a pictorial view of the completed header of FIG. 2.

Referring now to FIG. 3, there is shown a complete view of the finished header with any suitable semiconductor device 46 mounted on the flat, upper surface 20 of the lead wire 18, the lower portion of that wire being embedded in the glass. The semiconductor device is mounted on the flattened surface 20 in any conventional manner so as to make electrical contact therewith, and suitable electrical lead wires 48 and 50 are provided to connect various regions of the semiconductor device with the leads 16 and 38, respectively. Although not shown in either FIGS. 1 or 2, the header has a third lead 38, above-mentioned, projecting through and hermetically sealed within the glass preform 8 substantially the same as lead 16. The case of the header may be provided with a top portion 40 extending inwardly well beyond that to which the lip portion 6 is shown to extend in the previous figures. This facilitates the use of a fourth lead, not shown, to establish an electrical connection to the case by butt-welding a lead to the underside of the top portion 40 so that the case can be grounded during operation. Like the other leads, the lead connected to the case is also sealed in the glass and similarly emerges from the bottom of the header. It should be understood, however, that the fourth lead and the top portion 40 may be dispensed with and do not pertain to this invention. Also, a peripheral tab 42 is commonly provided on the annular flange 4 to facilitate orientation of the transistor leads. Fnally, a transistor can (not shown) is provided over the top of the header and welded to the annular flange 4 in a conventional manner to encapsulate the device.

Figure 4:
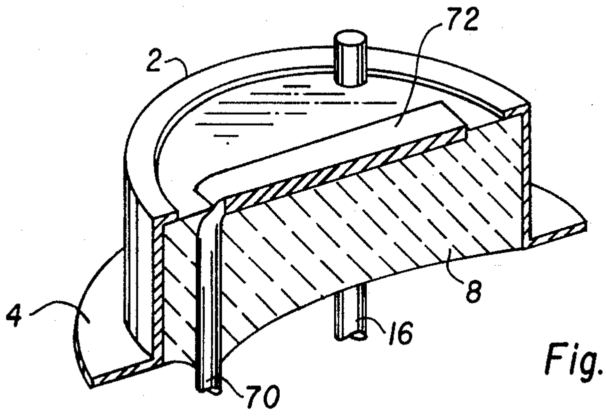
FIG. 4 is a view in section of another embodiment of the invention.
Figure 5:
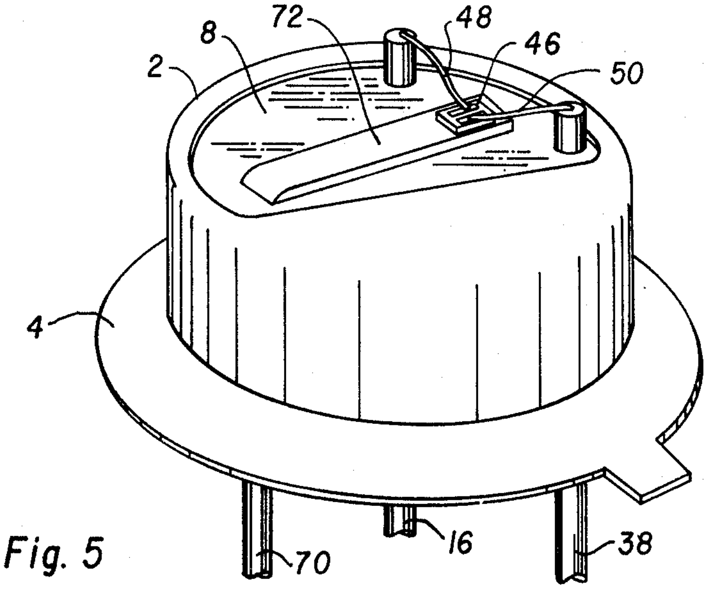
FIG. 5 is a pictorial view of the completed header of FIG. 4.

Referring now to FIG. 4, there is shown another embodiment of the invention wherein the preshaped lead, now designated as numeral 70, is formed by bending a straight length of Kovar wire at right angles and flattening the portion 72 as shown. The lead is then inserted through a hole in the glass preform of the header so that the flattened portion is in contact with the upper surface thereof. Alternatively, a suitable recess similar to that designated at numeral 14 in FIG. 1 can be provided to facilitate the orientation of the flattened portion. In this instance the recess aids in maintaining the lead at the predetermined location during the heating and bonding of the glass thereto. Moreover, any suitable means can be utilized to exert a slight pressure on the flattened portion during this operation to further prevent any relative movement of the parts of the header. This configuration, although being slightly more difficult to ensure proper bonding of the glass to the lead, is simpler in design and has the advantage of lower production costs in preforming the lead. A complete view of the unit is shown in FIG. 5, and like the first embodiment, the flattened portion 72 of the lead is partially embedded in the glass to ensure a rigid platform for transistor mounting. Also, the header can be provided with a fourth lead connected to the header case, as described in conjunction with the first embodiment.

Figure 6:
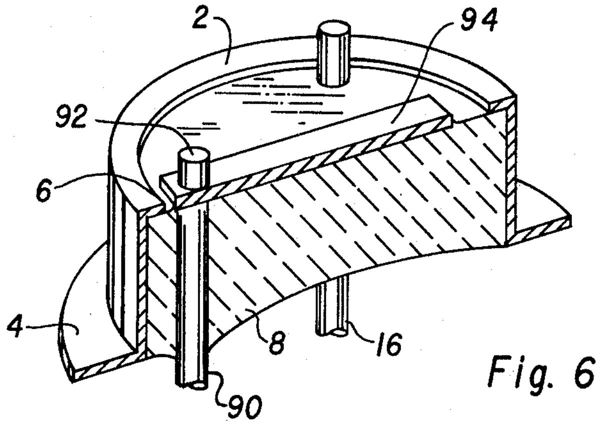
FIG. 6 is a view in section of yet another embodiment of the invention.
Figure 7:
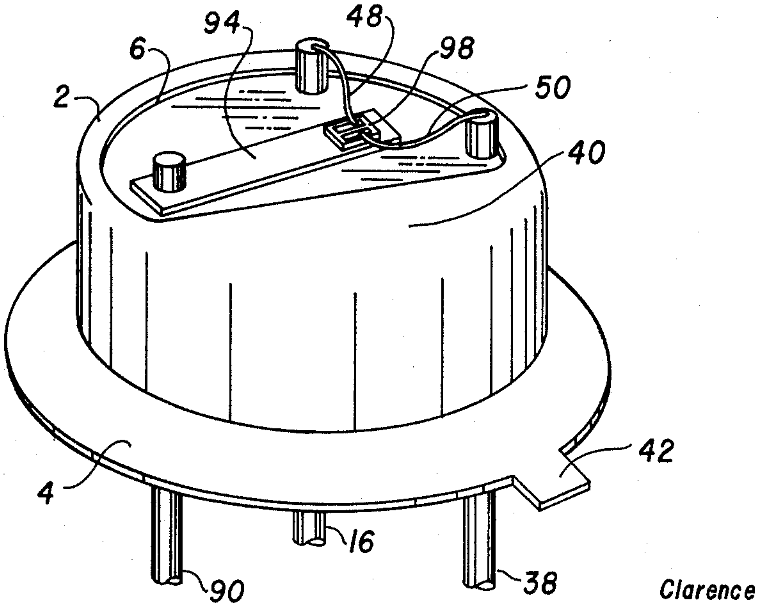
FIG. 7 is a pictorial view of the completed header of FIG. 6.

A third embodiment, shown in FIGS. 6 and 7, is suitable for mounting larger semiconductor devices than either of the two previous embodiments. As shown in FIG. 6, a metallic plate 94 of any desired length and width and having a hole in one end for receiving therethrough a lead 90 is used instead of the flattened-wire configuration shown in FIGS. 1–5. The plate 94 is electrically connected to the lead 90 by any suitable means such as welding, soldering or the like. A portion 92 of the lead protrudes above the surface of the glass preform 8, for purposes previously described. A view of the complete header configuration is shown in FIG. 7. Because of the flexibility in the size of the metallic plate that can be used, semiconductor devices of a greater variety of sizes can be mounted on the plate. Moreover, this embodiment has all of the characteristics and advantages of the stabilized mounting surfaces of the previous embodiments.

An important feature of the invention resides in the fact that the mounting surface for the semiconductor device is not subject to cantilever action, namely, a mounting surface that is fixed on only one end. Therefore, severe vibrations, accelerations and the like do not cause a relative movement between the semiconductor device and any of the leads.

Although the invention has been described with reference to specific embodiments, it will be apparent that certain modifications and substitutions will fall within the scope of the invention as defined by the appended claims.

What is claimed is:

1. A semiconductor device header comprising a metallic shell encasing a body of insulating material and a plurality of leads passing through said body and electrically isolated from said shell, one of said leads being bent at substantially a 90° angle to the portion of said lead passing through said insulating material and bent through a 180° angle to fold back upon said first-mentioned bent portion, terminating in a portion bent at substantially a 90° angle to said second bent portion and positioned in line with the portion passing through said insulating material, said first and second bent portions of said lead being flattened and embedded in a surface of said insulating material and having an exposed surface for mounting a semiconductor device thereon.

2. A semiconductor device header comprising a metallic shell having a flange at one end thereof and encasing a body of insulating material and a plurality of leads passing through said insulating material and electrically insulated from each other and said shell, one of said lead wires having a portion bent at approximately a 90° angle to that portion of the lead wire extending through said insulating material and bent back upon itself, flattened and embedded in said insulating material at the end opposite said flange to form a stable platform for mounting a transistor thereon.

3. A semiconductor device header as defined in claim 2 in combination with a semiconductor device mounted thereon.

4. A semiconductor device header as defined in claim 2 wherein the width of said mounting platform is greater than the diameter of said one of said leads.

5. A semiconductor device header comprising an open ended metallic shell having a flange at one end thereof and encasing a body of insulating material, said insulating material being exposed at each of said open ends, and a plurality of lead wires passing through said insulating material and electrically insolated from each other and said shell, one of said leads being a homogeneous bar comprising a flat portion extending along and partially embedded in the surface of said insulating material and a second portion bent at one end of said bar extending through said insulating material at approximately a 90° angle to said first portion, thereby to provide a mounting surface for a semiconductor device and a terminal therefor.

6. A semiconductor device header as defined in claim 5 in combination with a semiconductor device mounted thereon.

7. A semiconductor device header as defined in claim 5 wherein the width of said mounting surface is greater than the diameter of said one of said leads.

References Cited by the Examiner

UNITED STATES PATENTS

| | | | |
|---|---|---|---|
| 2,745,045 | 5/56 | Ingraham | 317—236 |
| 2,751,527 | 6/56 | Shower | 317—235 |
| 2,762,956 | 9/56 | Ingraham | 317—236 |
| 2,825,857 | 3/58 | Salecker | 317—235 |
| 2,935,665 | 5/60 | Coyle | 317—234 |
| 2,948,951 | 8/60 | Dillaby | 317—235 |
| 3,020,454 | 2/62 | Dixon | 317—235 |
| 3,021,461 | 2/62 | Oakes et al. | 317—235 |
| 3,080,510 | 3/63 | Breuer | 317—234 |
| 3,099,776 | 7/63 | Henneke | 317—235 |
| 3,114,088 | 12/63 | Abercrombie | 317—234 |

DAVID J. GALVIN, *Primary Examiner.*

JAMES D. KALLAM, *Examiner.*